United States Patent
Husmann et al.

(10) Patent No.: US 7,641,389 B2
(45) Date of Patent: Jan. 5, 2010

(54) MAGNETIC DEVICES

(75) Inventors: Anke Husmann, Cambridge (GB);
Michael Pepper, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 102 days.

(21) Appl. No.: 11/686,719

(22) Filed: Mar. 15, 2007

(65) Prior Publication Data

US 2007/0267596 A1 Nov. 22, 2007

(51) Int. Cl.
*G01K 7/00* (2006.01)
(52) U.S. Cl. .................... 374/176; 374/163; 374/177
(58) Field of Classification Search ............... 374/176, 374/177, 163
See application file for complete search history.

(56) References Cited

U.S. PATENT DOCUMENTS

| | | | |
|---|---|---|---|
| 6,807,091 B2 * | 10/2004 | Saito | 365/173 |
| 7,307,875 B2 * | 12/2007 | Johnson | 365/158 |
| 2004/0257714 A1 * | 12/2004 | Takahashi et al. | 360/322 |
| 2005/0012129 A1 * | 1/2005 | Saito | 257/296 |
| 2005/0083032 A1 * | 4/2005 | Goldfine et al. | 324/71.1 |
| 2005/0195532 A1 * | 9/2005 | Sugiyama et al. | 360/322 |
| 2007/0007609 A1 * | 1/2007 | Saito et al. | 257/421 |
| 2007/0253120 A1 * | 11/2007 | Saito et al. | 360/324.11 |
| 2008/0165453 A1 * | 7/2008 | Kaiser et al. | 360/324.2 |

FOREIGN PATENT DOCUMENTS

| | | |
|---|---|---|
| GB | 2 388 915 A | 11/2003 |
| GB | 2 406 962 A | 4/2005 |
| WO | WO 03/089946 A1 | 10/2003 |

OTHER PUBLICATIONS

Perry Czimmek, "Characterization of Magnetic Shape Memory Material", Siemen VDO Automotive Engineering Report, downloaded from: http://asmeaternvirginia.tripod.com/educatio/seminar05/asm__msm__czimmek.pdf, May 24, 2004, 12 pages.

T. J. Zhu, et al., "Growth and magnetic properties of NiMnGa thin films prepared by pulsed laser ablation", IoP Electronic Journal, downloaded from: http://www.iop.org/EJ/abstract/0964-1726/14/5/018, Aug. 24, 2005, 1 page.

* cited by examiner

*Primary Examiner*—Gail Verbitsky
*Assistant Examiner*—Mirellys Jagan
(74) *Attorney, Agent, or Firm*—Oblon, Spivak, McClelland, Maier & Neustadt, L.L.P.

(57) ABSTRACT

A sensor comprises a reference sample arranged to be subject to at least one variable physical parameter such that a variation in the value of the at least one variable physical parameter causes a change in the magnetisation of the reference sample, means for measuring the magnetisation of the reference sample, and means for determining in dependence upon the measured magnetisation whether there has been a variation in the value of the at least one variable physical parameter, wherein the reference sample comprises a Heusler alloy.

19 Claims, 9 Drawing Sheets

MAGNETIC DEVICES

CROSS-REFERENCE TO RELATED APPLICATIONS

This application claims priority from UK application number 0605219.5 filed 15 Mar. 2006, the contents of which are incorporated herein by reference.

BACKGROUND OF THE INVENTION

The present invention relates to magnetic devices and in particular to the use of Heusler alloys in magnetic devices.

Heusler alloys may order in the $L2_1$ form, a crystal structure that determines the crystal arrangements of the elements in the Heusler alloy with respect to one another.

The Heusler alloys which are of interest exhibit itinerant ferromagnetic behaviour. This means that the magnetic moments which are ferromagnetically ordered below the Curie temperature are associated with electrons which show extended behaviour and are able to move through the material rather than being localised to particular atomic sites.

Certain Heusler alloys exhibit half-metal behaviour below the Curie temperature, in which, at the Fermi energy, there is a band gap in the density of states for one spin direction of the electrons and no band gap—and hence spin-polarised metallic behaviour—in the density of states for the other spin direction.

Heusler alloys which exhibit spin-polarised metallic behaviour as described in the preceding paragraph have been the subject of interest in relation to their possible use in spintronics applications, for instance in spin-polarised tunnel junctions or in magnetic memory read/write heads. Such uses for Heusler alloys exhibiting spin-polarised metallic behaviour require that the alloys are well below their Curie temperature, and thus efforts have been made to find, and to use, Heusler alloys having Curie temperatures far above room temperature.

SUMMARY OF THE INVENTION

In contrast, it is a discovery pursuant to the present invention that Heusler alloys exhibit magnetic behaviour at and near their Curie temperature which makes them suitable for use in a number of different magnetic devices.

In a first aspect of the present invention, there is provided a sensor, comprising a reference sample arranged to be subject to at least one variable physical parameter such that a variation in the value of the at least one variable physical parameter causes a change in the magnetization of the reference sample, means for measuring the magnetization of the reference sample, and means for determining in dependence upon the measured magnetization whether there has been a variation in the value of the at least one variable physical parameter, wherein the reference sample comprises a Heusler alloy.

The sensitivity of such a sensor is dependent on the variation of the measured magnetization with the value of the at least one variable physical parameter. It is a discovery pursuant to the present invention that certain Heusler alloys have a magnetization which varies strongly with variable physical parameters. That strong variation makes those Heusler alloys particularly suitable for use in such sensors. The variation may be particularly strong around the transition between the ferromagnetically ordered and paramagnetic states.

The sensor may comprise, for instance:—a thermometer, a bolometer, a magnetometer, or a pressure sensor. The sensor may comprise, or be included in included in another device such as a memory device, a switching device, a detection device, or an imaging device.

Preferably, the at least one variable physical parameter comprises at least one of temperature, pressure and magnetic field.

The determining means may be adapted to determine the value of the at least one variable physical parameter in dependence upon the measured magnetization.

The determining means may be in the form of a processor, such as a programmable computer, programmed to calculate the value of the at least one variable physical parameter. The determining means may comprise a look-up table which provides value of variable physical parameters corresponding to values of measured magnetization.

The sensor may further comprise control means adapted to control at least one physical parameter so as to ensure that the Heusler alloy is close to a transition between a first state and a second state, the first state comprising a ferromagnetically ordered state and the second state comprising a paramagnetic state.

In the transition region, the magnetization may vary particularly strongly with the at least one variable physical parameter.

Preferably the sensor is arranged so that a change in the at least one variable physical parameter by at least a pre-determined amount causes the reference sample to change between a first state and a second state, and the determining means may be adapted to determine, in dependence on the measured magnetization, whether the reference sample is in the first state or the second state.

Thus, the sensor may be a transition-edge sensor.

The first state may comprise a ferromagnetically ordered state, and the second state may comprise a paramagnetic state. The transition between the ferromagnetically ordered state, and the paramagnetic state is particularly sharp and pronounced in certain Heusler alloys, thus giving a sensor with high sensitivity.

The first state may comprise a state in which the magnetization of reference sample is in a first direction and the second state may comprise a state in which the magnetization of the reference sample is in a second direction.

That feature may be particularly useful as the sensor may thus be able to give an indication of the magnetic field to which the reference sample was subject in the past. Therefore, the sensor may advantageously be used as a memory device or a switch.

The sensor may further comprise output means adapted to generate a first signal if the reference sample is in the first state and to generate a second signal if the reference sample is in the second state.

The at least one variable physical parameter may be one of pressure and magnetic field and the apparatus may further comprise means for controlling the temperature of the reference sample to be a pre-determined temperature, the predetermined temperature may be at or near the Curie temperature ($T_C$) of the Heusler alloy.

As the pre-determined temperature may be at or near the Curie temperature of the Heusler alloy, the magnetization of the Heusler alloy may vary rapidly with the variable environmental parameter, and thus provide good sensitivity.

The transition between the ferromagnetically ordered state and the paramagnetic state may be characterised in terms of the quantity dM/MdT (in units of 1/K), where M is the magnetization and T is the temperature (in K).

We define a temperature $T_{max}$ as being the highest temperature on the ferromagnetically ordered side of the transition for which the quantity dM/MdT (in units of 1/K) is less than 0.1. The magnetization at that temperature is considered to be $M_{max}$.

We define the lowest temperature at which the magnetization is 10% of $M_{max}$ as being $T_{min}$ and the magnetization at that temperature is defined as being $M_{min}$. The temperature $T_{min}$ will be greater than the temperature $T_{max}$.

The transition width is then defined as being $T_{min}-T_{max}$. The Curie temperature ($T_C$) as used herein, is defined as being $T_{max}+(T_{min}-T_{max})/2$.

Preferably the pre-determined temperature is a temperature in a range from $T_C-10K$ to $T_C+10K$, preferably in a range from $T_C-5K$ to $T_C+5K$, and more preferably in a range from $T_C-1K$ to $T_C+1K$.

The reference sample may be thermally linked to a heat sink, and the sensor may comprise means for controlling the temperature of the heat sink to be a pre-determined temperature, the pre-determined temperature may be at or near the Curie temperature of the Heusler alloy.

Thus there is provided a particularly effective means for maintaining the reference sample close to the transition between the ferromagnetically ordered state and the paramagnetic state and thus for providing a sensor having high sensitivity.

Preferably the pre-determined temperature is a temperature in a range from $T_C-10K$ to $T_C+10K$, preferably in a range from $T_C-5K$ to $T_C+5K$, and more preferably in a range from $T_C-1K$ to $T_C+1K$.

The sensor may be arranged so that absorption of energy by the reference sample causes a rise in temperature of the reference sample.

The sensor may be a bolometer.

That feature is particularly important, and so in a further independent aspect there is provided a bolometer, comprising a reference sample arranged so that absorption of energy by the reference sample causes a rise in temperature of the reference sample and consequently a change in magnetization of the reference sample, and means for measuring the change in magnetization of the reference sample, wherein the reference sample comprises a Heusler alloy.

It is a discovery pursuant to the present invention that Heusler alloys may have a particularly large and sharp variation of magnetization in the region around the transition between the ferromagnetically ordered and paramagnetic states, with little hysteresis, which make them particularly suitable for use in bolometers.

The bolometer may further comprise determining means for determining the amount of the energy absorbed by the reference sample and/or the rate at which the energy is absorbed by the reference sample, in dependence upon the measured change in magnetization. Preferably the determining means is adapted to determine the rise in temperature.

The absorption of energy may comprise absorption of radiation, preferably infra-red radiation.

The sensor or bolometer may be exposed to a known radiation source, for calibration of the sensor or bolometer, or for calibration of the radiation source. Alternatively the sensor or bolometer may be exposed to an unknown radiation source, and may be adapted to measure the radiation emitted by the unknown radiation source.

The at least one variable physical parameter may comprise magnetic field.

The change in magnetization may comprise a change in direction of magnetization, and the means for measuring the magnetization may be adapted to measure the direction of the magnetization.

The sensor may further comprise means for changing the direction of magnetization of the reference sample. The means for changing the direction of magnetization may comprise means for heating the reference sample to cause it to pass from a ferromagnetically ordered state to a paramagnetic state, and means for applying a magnetic field to the reference sample, the means for changing the direction of magnetization being adapted to allow the sample to cool and to enter the ferromagnetically ordered state whilst or after the magnetic field is applied.

Preferably the sensor comprises, or is included in, a magnetic memory device.

That feature is particularly important, and so in a further independent aspect there is provided A magnetic memory device, comprising a reference sample, the reference sample comprising a Heusler alloy, the device further comprising means for measuring the magnetization of the reference sample and means for changing the direction of magnetization of the reference sample, the means for changing the direction of magnetization of the sample comprising means for heating the reference sample to cause it to pass from a ferromagnetically ordered state to a paramagnetic state and means for applying a magnetic field to the reference sample.

It is a discovery pursuant to the present invention that Heusler alloys may have a particularly large and sharp variation of magnetization in the region around the transition between the ferromagnetically ordered and paramagnetic states which make them particularly suitable for use in magnetic memory devices.

One direction of magnetization of the reference sample in the ferromagnetically ordered state may represent one value of a data bit, and another direction of magnetization of the reference sample in the ferromagnetically ordered state may represent another value of the data bit.

The heating of the reference sample into the paramagnetic state before changing the direction of the magnetization is particularly advantageous as it means that the memory device may be completely cleared and there may be no residual memory of the value of a data bit previously stored by the memory device. That may particularly important if the memory device is used for high security applications or data. It also provides a particularly easy way of clearing the memory device.

The size and sharpness of the change in magnetization at the transition between the ferromagnetically ordered state and the paramagnetic state means provides the advantage that there is little risk of the magnetization of the reference sample in the ferromagnetically ordered state changing direction spontaneously due to extraneous effects, even if the reference sample is at a temperature relatively close to the Curie temperature.

Preferably the means for changing the direction of magnetization is adapted to allow the sample to cool and to enter the ferromagnetically ordered state whilst or after the magnetic field is applied.

The magnetic memory device or sensor may comprise an array of reference samples. Thus the value of many data bits may be stored by the device or sensor.

The magnetic memory device may be, for example, a hard disc drive or a magnetic random access memory (MRAM) device.

The magnetic memory device or sensor may be included in an array of magnetic memory devices or sensors.

The magnetic memory device or sensor may further comprise selection means for selecting a reference sample from the array of reference samples, and the measuring means may be adapted to measure the magnetization of the selected one of the array of reference samples, and the means for changing the magnetization may be adapted to change the magnetization of the selected one of the array of reference samples.

Preferably the measuring means and/or the means for changing the direction of magnetization are adapted to move relative to the reference sample or array of reference samples.

Preferably the measuring means and the means for changing the direction of magnetization may be included in a read/write head.

In a further independent aspect there is provided a magnetic refrigerant comprising a Heusler alloy.

It is a discovery pursuant to the present invention that Heusler alloys may have a particularly large magnetocaloric effect in the region around the transition between the ferromagnetically ordered and paramagnetic states which make them particularly suitable for use as magnetic refrigerants.

Consideration is now given to the characteristics of Heusler alloys which may be included in a sensor, bolometer, magnetic memory device, or magnetic refrigerant.

Preferably there is provided a sensor, bolometer, magnetic memory device or magnetic refrigerant in which the Heusler alloy has the $L2_1$ structure. Preferably the Heusler alloy comprises three elements. Preferably the Heusler alloy comprises at least one additional element, the at least one additional element partially substituting for at least one of the three elements.

Preferably the Heusler alloy has the general formula $\alpha_2\beta\gamma$, where each of the three elements is represented by $\alpha$, $\beta$, and $\gamma$ respectively.

Preferably the three elements comprise any three from Co, Cr, Ti, Sn, Al, Fe, Mn. Preferably the at least one additional element comprises at least one from Co, Cr, Ti, Sn, Al, Fe, Mn.

Alternatively or additionally the three elements may comprise any three from the following list, or the at least one additional element may comprise at least one from the following list:—Co, Cr, Ti, Sn, Al, Fe, Mn, Ni, Cu, Ag, Au, Zn, Ru, Ni, Mb, Pt, Hg, W, Ni, Mo. Preferably the three elements comprise any three transition metals and/or the at least one additional element comprises at least one transition metal.

The Heusler alloy may comprise $Co_{2+x-y}Cr_{1+y}Al_{1-x}$. Preferably the Heusler alloy comprises $Co_{2+x-y}(Cr,Fe)_{1+y}Al_{1-x}$ or $Co_{2+x-y}(Cr,Mn)_{1+y}Al_{1-x}$.

Preferably the value of x is in the range $-0.10 \leq x \leq 0.10$, preferably $-0.05 \leq x \leq 0.05$, and more preferably $-0.02 \leq x \leq 0.02$. Preferably the value of y is in the range $-0.10 \leq y \leq 0.10$, preferably $-0.05 \leq y \leq 0.05$, and more preferably $-0.02 \leq y \leq 0.02$.

The Heusler alloy may comprise $Co_{2+a-b}Ti_{1+b}Sn_{1-a}$. Preferably the Heusler alloy comprises $Co_{2+a-b}Ti_{1+b}(Sn,Al)_{1-a}$.

The value of a may be in the range $-0.10 \leq a \leq 0.10$, preferably $-0.05 \leq a \leq 0.05$, and more preferably $-0.02 \leq a \leq 0.02$. The value of b may be in the range $-0.10 \leq b \leq 0.10$, preferably $-0.05 \leq b \leq 0.05$, and more preferably $0.02 \leq b \leq 0.02$.

The Heusler alloy, in the absence of an applied magnetic field, may have a Curie temperature of between 250K and 450K, preferably between 300K and 400K, and more preferably between 320 and 340K.

Thus the transition between the ferromagnetically ordered state and the paramagnetic state may occur relatively close to room temperature, preferably above room temperature.

Preferably the transition between the ferromagnetically ordered state and the paramagnetic state has at least some characteristics which are like those of a first order phase transition. The transition between the ferromagnetically ordered state and the paramagnetic state may be comprise second order-like characteristics over part of the transition region and may comprise first-order like characteristics over another part of the transition region. Alternatively the transition between the ferromagnetically ordered state and the paramagnetic state may be a first order phase transition.

Preferably, in the absence of an applied magnetic field, the ferromagnetic transition of the Heusler alloy has a transition width of less than 40K, preferably less than 10K, and more preferably less than 5K.

The Curie temperature may vary with applied magnetic field, and preferably the Curie temperature in an applied magnetic field of 5Tesla is lower than the Curie temperature in zero applied magnetic field by at least 1K, preferably by at least 5K, and even more preferably by at least 10K.

Preferably the Curie temperature varies with applied magnetic field by up to 1K/Tesla, preferably by up to 2K/Tesla, and more preferably by up to 5K/Tesla.

Preferably the Heusler alloy, in the absence of an applied magnetic field, has a ferromagnetic transition in which dM/MdT (in units of 1/K) is greater than 0.1, preferably greater than 0.5, and more preferably greater than 0.9, wherein M is the spontaneous magnetization of the Heusler alloy, and T is the temperature of the Heusler alloy in K.

The Heusler alloy may exhibit spin-polarised metallic behaviour below its Curie temperature.

In a further independent aspect there is provided a heat transfer apparatus, comprising a magnetic refrigerant, the magnetic refrigerant a Heusler alloy, the apparatus further comprising means for applying a magnetic field to the magnetic refrigerant and for varying the value of the applied magnetic field so as to increase the magnetic order of the magnetic refrigerant thereby to cause an increase in temperature of the magnetic refrigerant, or so as to decrease the magnetic order of the magnetic refrigerant thereby to cause a decrease in the temperature of the magnetic refrigerant, a heat transfer medium, and means for transferring heat between the heat transfer medium and the magnetic refrigerant.

Preferably the control means is adapted to control at least one physical parameter so as to ensure that the Heusler alloy is close to a transition between a ferromagnetically ordered state and a paramagnetic state.

Preferably the applying and varying means is adapted to vary the magnetic field so as to move the Heusler alloy between the ferromagnetically ordered state and a paramagnetic state.

In a further independent aspect, there is provided a method of transferring heat, comprising providing a magnetic refrigerant, the magnetic refrigerant comprising a Heusler alloy, the method further comprising varying the value of a magnetic field applied to the magnetic refrigerant so as to increase the magnetic order of the magnetic refrigerant thereby causing an increase in temperature of the magnetic refrigerant, or so as to decrease the magnetic order of the magnetic refrigerant thereby causing a decrease in the temperature of the magnetic refrigerant, and transferring heat between the magnetic refrigerant and a transfer medium due to the increase or decrease in temperature of the refrigerant.

The step of varying the value of the magnetic field may comprise varying the value of the magnetic field so as to move the magnetic refrigerant between a ferromagnetically ordered state and a paramagnetic state.

In a further independent aspect there is provided a method of detecting a change in at least one variable physical parameter, comprising subjecting a reference sample comprising a Heusler alloy to the at least one variable physical parameter, measuring the magnetization of the reference sample, and determining whether there has been a variation in the value of the at least one variable physical parameter in dependence on the measured magnetization.

In another independent aspect there is provided a method of measuring energy emitted by a radiation source, comprising exposing a reference sample comprising a Heusler alloy to the radiation source, measuring the magnetization of the reference sample, and determining the amount of energy absorbed by the reference sample in dependence on the measured magnetization.

In another independent aspect there is provided a method of storing data, comprising heating a reference sample comprising a Heusler alloy such that it passes from a ferromagnetically ordered state to a paramagnetic state, applying a magnetic field to the reference sample and allowing it to cool so as to pass from the paramagnetic state to the ferromagnetically ordered state, wherein the magnetic field is applied in such a way as to ensure that the magnetization of the reference sample in the ferromagnetically ordered state is in a desired direction, the direction of magnetization representing the value of a data bit.

In further independent aspects there is provided a method, sensor, bolometer, magnetic memory device, magnetic refrigerant, heat transfer apparatus or other apparatus substantially as herein described, with reference to the accompanying drawings.

Any feature in one aspect of the invention may be applied to another aspect of the invention, in any appropriate combination. In particular, apparatus features may be applied to method features and vice versa.

BRIEF DESCRIPTION OF THE DRAWINGS

Preferred features of embodiments of the invention will now be described, purely by way of example, and with reference to the accompanying drawings in which.

DETAILED DESCRIPTION OF THE INVENTION

The compound $Co_2CrAl$ is a Heusler alloy which has a transition between a ferromagnetically ordered state and a paramagnetic state, at a Curie temperature, $T_C$.

In the preferred embodiments, a sample of $Co_2CrAl$ is used as a reference sample in various magnetic devices. The behaviour of $Co_2CrAl$ at and close to the transition between the ferromagnetically ordered state and the paramagnetic state makes it particularly suitable for use in such magnetic devices.

The characteristics of the ferromagnetic transition in $Co_2CrAl$ that, variously, make it particularly well suited for use in magnetic devices include:—the Curie temperature being just above room temperature, the sharpness and size of the change in magnetization (at least in zero or low applied magnetic field), the lack of hysteresis in the magnetization, and the significant magnetocaloric effect.

Examples of magnetic devices according to preferred embodiments are now described.

Memory Device

Various memory devices (for instances hard disc drives and MRAMs) and methods for storing data using such devices are known. In particular embodiments, known devices and methods are used with, in each case, the magnetic material used for storing data being replaced by $Co_2CrAl$, or by $Co_2TiSn$, or by another Heusler alloy. In such embodiments, additional temperature measurement and control circuitry is provided to ensure that the magnetic material is in the ferromagnetically ordered state close to the transition between the ferromagnetically ordered state and the paramagnetic state. In such embodiments additional means for heating the magnetic material so as to move it into the paramagnetic state, and means for changing the direction of magnetization of the magnetic material are also provided.

In the preferred embodiment of a memory device, the value of a data bit is represented by the magnetization of a region of $Co_2CrAl$ in the ferromagnetically ordered state either being directed in one direction or in an opposite direction.

Figure 1:
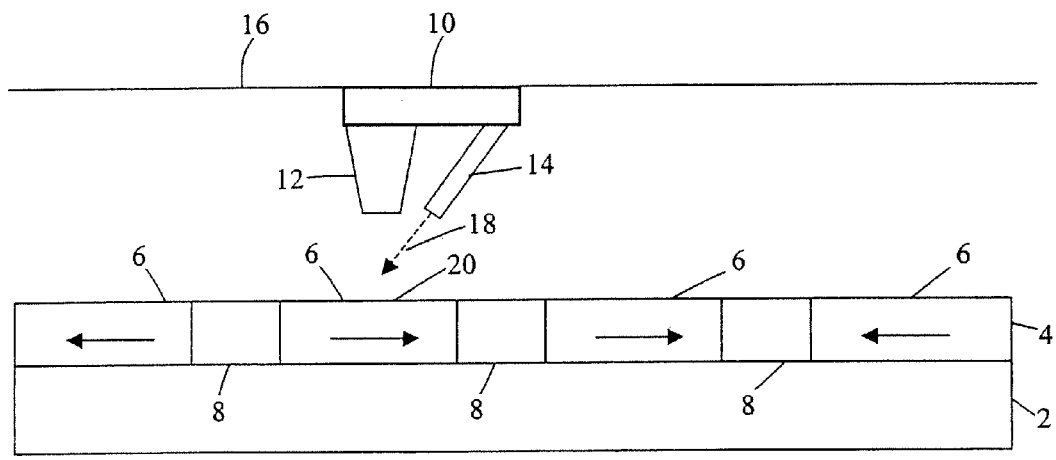
FIG. 1 is a schematic diagram of a magnetic memory device.

An example of a memory device in the preferred embodiment is illustrated schematically in FIG. 1.

The memory device comprises a substrate 2 on top of which $Co_2CrAl$ 4 is deposited.

The value of each individual data bit stored in the memory device is represented by the direction of magnetization of a respective region 6 of $Co_2CrAl$ located at a respective area of the substrate. The regions 6 of $Co_2CrAl$ form a two-dimensional array.

In the preferred embodiment, the regions 6 of the $Co_2CrAl$ are separated by intermediate regions 8 of insulating material which are also deposited on the substrate. In variants of the preferred embodiment, no material is present in the intermediate regions 8 between the regions 6 of $Co_2CrAl$. In still other variants of the preferred embodiment, the $Co_2CrAl$ is deposited across the whole of the substrate 2 and $Co_2CrAl$ is present both in the regions 6 and the intermediate regions 8.

The memory device comprises temperature measurement and control circuitry (not shown), a thermometer (not shown), and a heater or fan (not shown), which are arranged to operate so as to maintain the temperature across the substrate to be, on average, within a pre-determined range of temperature, the pre-determined range of temperature being below the Curie temperature. $Co_2CrAl$ is particularly advantageous for use in a memory device in the preferred embodiment as the expected operating temperature of the device, even without use of the heater or fan, is at a suitable temperature below the Curie temperature.

The memory device includes a read-write assembly 10 comprising a magnetic read-write head 12 and a laser 14 mounted next to the magnetic read write head 12. The read-write assembly 10 is located above the substrate and is moveable across the substrate along a guide assembly 16. The laser 14 is arranged so as to be directed at the area of the substrate beneath the read-write head. The laser includes a shutter (not shown) which is operable to open and expose the area of the substrate beneath the read-write head to the laser beam 18 produced by the laser and to close so as to block the laser beam from reaching the area of the substrate.

In operation, if it is desired to change the value of a data bit stored by the memory device, the read-write assembly 10 is moved over the substrate, with the laser shutter closed, until the read-write head 12 is positioned over the region 6 of $Co_2CrAl$ corresponding to the data bit. The laser shutter is then opened and the region 6 of $Co_2CrAl$ corresponding to the data bit is exposed to the laser beam and heats up above the Curie temperature and thus passes from the ferromagnetically ordered state to the paramagnetic state.

The read-write head then applies a magnetic field in the same direction as the direction of magnetization which is to represent the new value of the data bit, and the shutter arrangement is closed.

The region 6 of $Co_2CrAl$ corresponding to the data bit then cools and re-enters the ferromagnetically ordered state, with the magnetic field applied by the read-write head ensuring that the magnetization is oriented in the desired direction.

The magnetic field applied by the read-write head is then switched off and the read-write head is moveable to read data from or write data to another area of the substrate.

Figure 2:
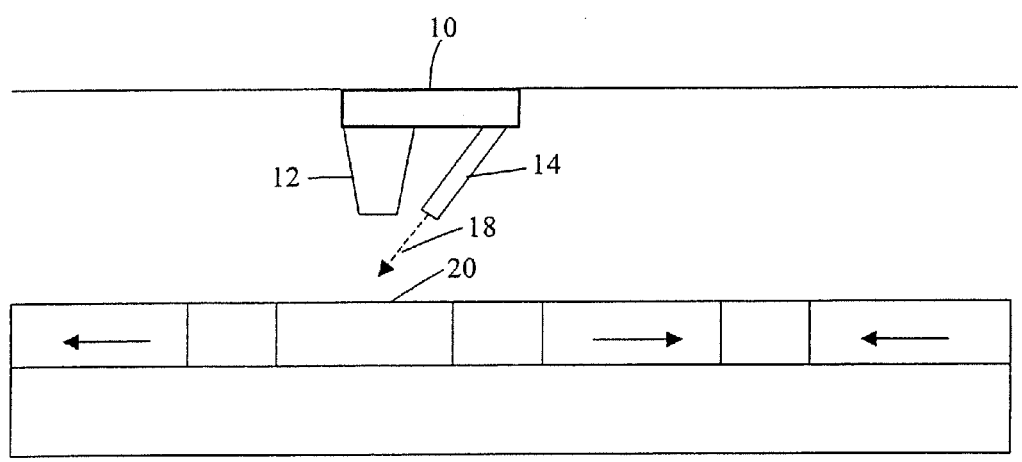
FIG. 2 is a schematic diagram of the magnetic memory device of FIG. 1, with a region of $Co_2CrAl$ in the paramagnetic state after being heated.
Figure 3:
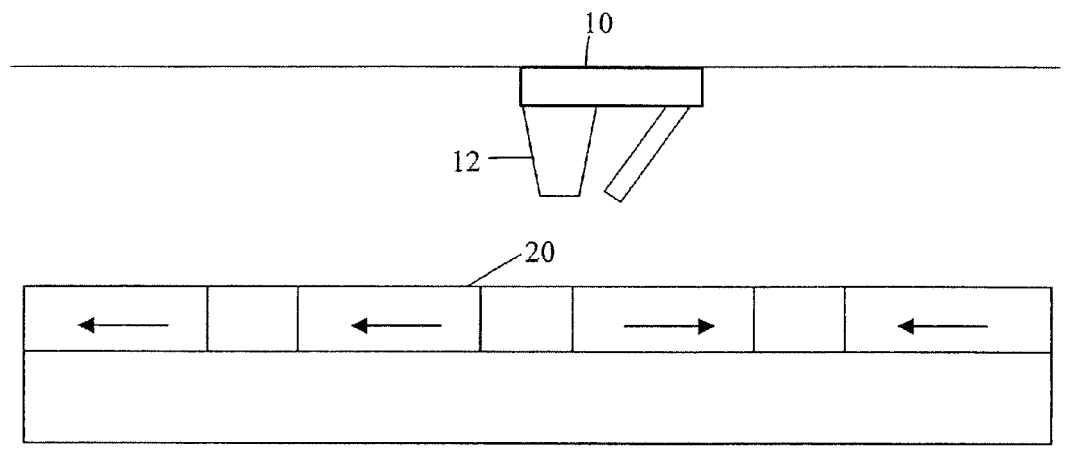
FIG. 3 is a schematic diagram of the magnetic memory device of FIG. 1 and FIG. 2, with the region of $Co_2CrAl$ in the ferromagnetically ordered state after cooling.

FIGS. 1, 2 and 3 show the preferred embodiment in operation, with respect to one particular region 20 of $Co_2CrAl$. In FIG. 1, the read-write head is positioned over the region 20, and the laser shutter has been opened and the laser beam 18 is heating the region 20. The region 20 has not yet heated above the Curie temperature and the region 20 is still in the ferromagnetically ordered state with the magnetization in one particular direction, as indicated by a solid arrow.

In FIG. 2, the region 20 has been heated above the Curie temperature and the magnetization is low compared to that in the ferromagnetically ordered state. Also, there is no particular direction of the magnetization as the read-write head has not been yet used to apply a magnetic field to the region 20. The memory state of the region 20 has been cleared by heating above the Curie temperature.

FIG. 3 shows the stage in the procedure after a magnetic field has been applied to the region 20 using the read-write head 12, after the laser shutter has been closed to allow the region 20 to cool below the Curie temperature, and after the read-write assembly has been moved away from the region 20. It can be seen that the region 20 is back in the ferromagnetically ordered state but that the direction of magnetization has now been changed, as desired. The direction of the magnetization is indicated by the solid arrow.

In an alternative to the preferred embodiment, the regions 6 of $Co_2CrAl$ are arranged to provide a geometric confinement effect to have an easy and a hard direction of magnetization. The regions 6 in that alternative embodiment each have an ellipsoid shape. In the preferred embodiment, the regions 6 are not shaped to have an easy and a hard direction of magnetization.

Bolometer

An example of another magnetic device is now described. The device is a preferred embodiment of an uncooled bolometer apparatus for detection of radiation, in particular infrared radiation.

Figure 4:
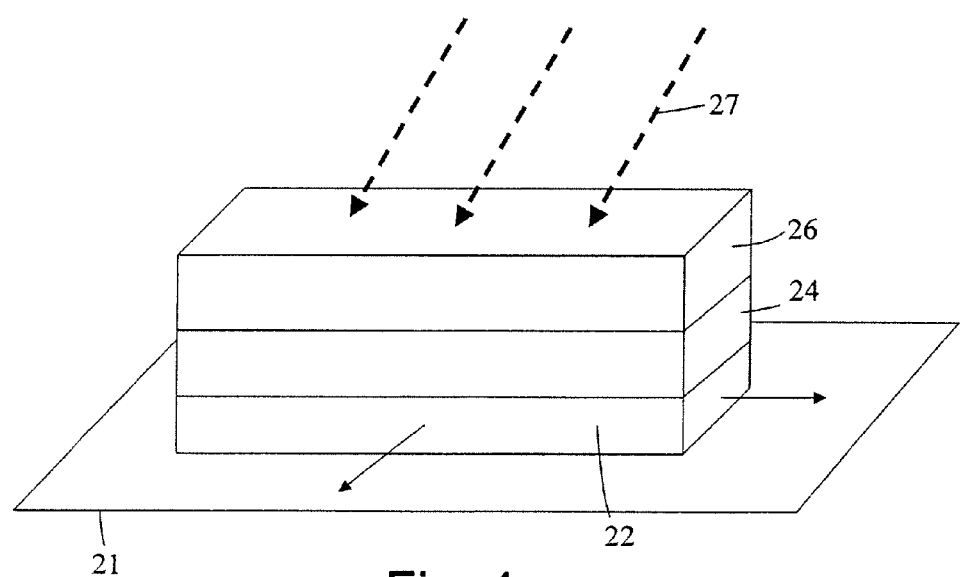
FIG. 4 is a schematic diagram of a layered structure for use in a bolometer.

The apparatus includes a layered structure, which is show schematically in FIG. 4.

The layered structure is deposited on a $SrTiO_3$ single crystal substrate 21. Other substrates are used in variants of the preferred embodiment The bottom layer comprises a Hall bar 22, deposited on the $SrTiO_3$ substrate 21. On top of the Hall bar layer 22 is deposited an insulating layer 24, and above the insulating layer 24 is deposited a layer of $Co_2CrAl$ 26. In operation the layer of $Co_2CrAl$ 26 may be exposed to radiation 27, for instance infra-red radiation.

Figure 5:
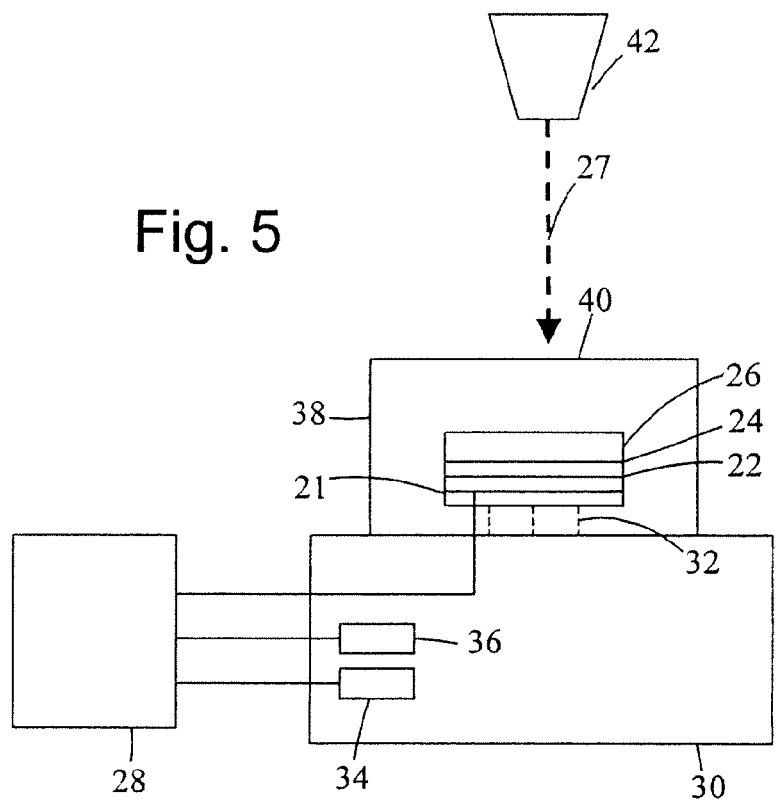
FIG. 5 is a schematic diagram of a bolometer.

Further details of the apparatus are shown schematically in FIG. 5.

The Hall bar 22 is connected to control and measurement circuitry 28 for controlling and/or measuring the voltages and currents (shown schematically by solid arrows in FIG. 4) through and across the bar. In the preferred mode of operation, the Hall bar is arranged so that the voltage measured across the bar varies in dependence on the spontaneous magnetization of the layer of $Co_2CrAl$ 26.

The $SrTiO_3$ substrate 21 is linked to a thermal mass 30 (typically copper) by a weak thermal link 32. Resistive heaters 34 and thermometers 36 are attached to the thermal mass and linked to a control computer included in the control and measurement circuitry 28. The control computer is programmed so as to maintain the thermal mass at a pre-determined temperature.

The $SrTiO_3$ substrate 21 is located within a device assembly 38, and a shutter arrangement 40 is located above the device assembly. In the closed position of the shutter arrangement 40, as shown in FIG. 5, the $SrTiO_3$ substrate and the layered structure are shielded from a radiation source 42 under consideration.

In operation, the control computer is programmed so as to maintain the thermal mass at a pre-determined temperature at or near the Curie temperature.

When the shutter arrangement 40 is closed, the layer of $Co_2CrAl$ 26 has a temperature the same as or close to that of the thermal mass 30, and thus is in a transition region, at or near the transition between the paramagnetic state and the ferromagnetically ordered state. In the transition region the spontaneous magnetization of the layer of $Co_2CrAl$ varies strongly with temperature.

Figure 6:
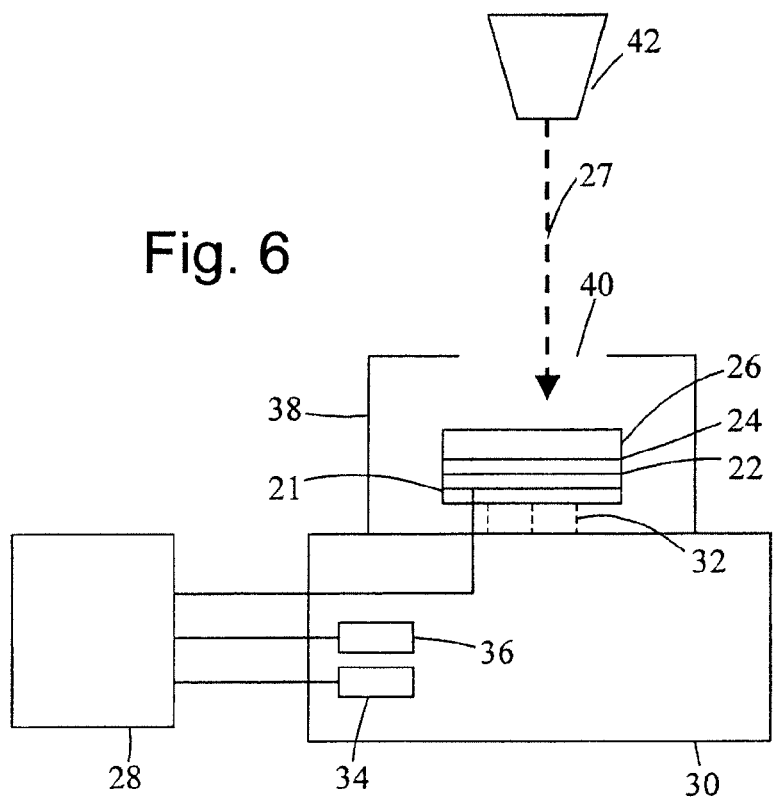
FIG. 6 is a schematic diagram of the bolometer of FIG. 2, with a shutter arrangement in an open position.

In operation, the shutter arrangement 40 is opened and the layer of $Co_2CrAl$ 26 may be irradiated, as shown in FIG. 6. If the layer of $Co_2CrAl$ 26 is irradiated and absorbs energy its temperature rises, and consequently its spontaneous magnetization changes. The change in spontaneous magnetization is detected by a change in the measured voltage across the Hall bar 22.

The change in temperature (and consequently the change in magnetization) is dependent on the heat capacity of the layered structure, the strength of the thermal link 32 to the thermal mass 30, and the power absorbed by the $Co_2CrAl$ layer 26. In the preferred embodiment, the detection and measurement circuitry 28 includes a processor programmed to determine the power absorbed by the $Co_2CrAl$ from the variation in measured voltage across the Hall bar 22.

Variants of the preferred embodiment are used in various different ways to carry out either absolute or relative measurements of the amount of energy or power absorbed by the $Co_2CrAl$ layer, and its variation as a function of time.

Variants of the preferred embodiment are calibrated in various ways, for instance by irradiating the $Co_2CrAl$ layer with an irradiation source of known power, or a series of irradiation sources of known powers, and measuring the corresponding changes in voltage, and/or by setting the temperature of the thermal mass to a series of known temperatures and measuring the voltages across the Hall bar.

In one variant of the preferred embodiment, a pair of bolometers as described above are linked and operated in a differential manner. The shutter arrangement of the first of the bolometers is kept closed throughout operation, whilst the shutter arrangement of the second of the bolometers is opened during operation. The voltage across the Hall bar of the first of the bolometers is compared to the voltage across the Hall bar of the second of the bolometers. In a further variant of the preferred embodiment, an array of bolometers as described above is provided.

In certain variants, threshold detection circuitry is included in the measurement and detection circuitry which compares the measured voltage to a pre-determined threshold and outputs a detection signal if the measured voltage exceeds the pre-determined threshold. In other variants, the measurement and detection circuitry is arranged so as output a detection signal if the measured voltage by an amount which indicates that there has been a transition between the paramagnetic state and the ferromagnetically ordered state.

Magnetic Refrigerator

Various apparatus and methods for magnetic refrigeration are known, and examples of such apparatus and method are described, for instance, in WO 03/050456, and U.S. Pat. No. 5,743,095, which are hereby incorporated by reference. In particular embodiments, magnetic refrigerators as described in those documents are used with, in each case, the magnetic refrigerant described in document being replaced by $Co_2CrAl$, or by $Co_2TiSn$, or by another Heusler alloy. In such embodiments, temperature measurement and control circuitry is provided to ensure that the magnetic refrigerant is close to the transition between the ferromagnetically ordered state and the paramagnetic state.

Some background information concerning magnetic refrigeration is now provided, before a magnetic refrigerator in the preferred embodiment is described.

All methods of magnetic refrigeration use materials exhibiting a magnetocaloric effect as a magnetic refrigerant.

Application of a magnetic field to a material exhibiting a magnetocaloric effect causes an increase in the magnetic component of the entropy of the material and a corresponding decrease in other components of the entropy of the material, usually manifesting itself as an increase in temperature of the material.

Removal of a magnetic field applied to a material exhibiting a magnetocaloric effect causes a decrease in the magnetic component of the entropy of the material and a corresponding increase in other components of the entropy of the material, usually manifesting itself as a decrease in temperature of the material.

Magnetic refrigeration, or heating, typically operates in a way analogous to refrigeration or heating using compression and expansion of compressible fluids. Usually a cycle of operations is performed on the refrigerant material (the magnetic refrigerant or, analogously, the compressible fluid), which causes the refrigerant material to alternately increase and decrease in temperature, and, typically, heat is passed between the refrigerant material and a heat transfer medium such as an intermediate fluid in response to the changes in temperature, the intermediate fluid being circulated between the refrigerant material and a material to be heated or cooled. Usually heat is also passed—either directly or indirectly—between the intermediate fluid and ambient at other stages in the cycle.

To obtain the maximum cooling—or heating—effect using magnetic refrigeration techniques it is important that the entropy change of the magnetic refrigerant in response to application of magnetic field is large.

In the preferred embodiment $Co_2CrAl$ is used as the magnetic refrigerant, and the range of temperature to which the $Co_2CrAl$ is subject controlled so as to ensure that the $Co_2CrAl$ is close to the ferromagnetic-paramagnetic transition as, in that region, small changes in magnetic field produce relatively large changes in magnetic entropy (reflected in relatively large changes in magnetization).

In broad terms, the preferred embodiment, or variants of the preferred embodiment, is arranged so as to carry out the following steps:—applying (or increasing) a magnetic field to the $Co_2CrAl$ so as to cause a transition from the paramagnetic state to the ferromagnetic state, passing heat from the $Co_2CrAl$ to a heat transfer medium such as an intermediate fluid, circulating the (now heated) intermediate fluid away from the $Co_2CrAl$ and allowing it to pass heat to ambient (either directly or indirectly), removing (or reducing) the applied magnetic field so as to cause a transition from the ferromagnetic state to the paramagnetic state and a consequential cooling of the $Co_2CrAl$, circulating the (or another) intermediate fluid back to the $Co_2CrAl$ and passing heat from that intermediate fluid to the $Co_2CrAl$, circulating the (now cooled) intermediate fluid to the material to be cooled, and passing heat from the material to be cooled to the intermediate fluid thus causing a cooling of the material to be cooled. The cycle is repeated, causing further cooling of the material to be cooled. The cycle can of course be operated in reverse to cause a heating rather than cooling of the material.

Figure 7:
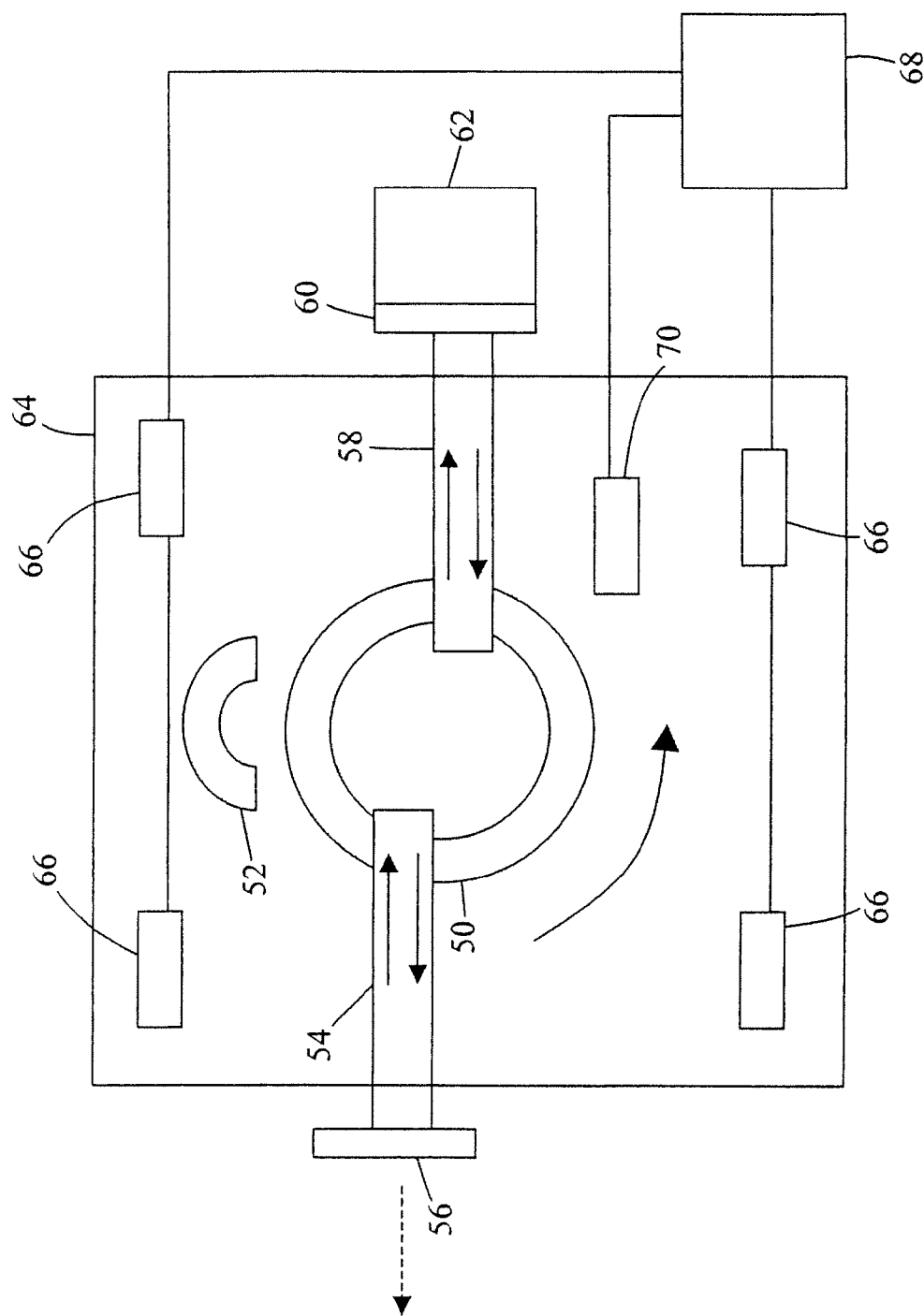
FIG. 7 is a schematic diagram of a magnetic refrigerator.

A magnetic refrigerator according to the preferred embodiment is illustrated in FIG. 7.

In the preferred embodiment, a powder of $Co_2CrAl$ is used as the magnetic refrigerant. The powder is obtained by grinding ingots of $Co_2CrAl$, the ingots being obtained using a method described below. The powder of $Co_2CrAl$ is placed in compartments of an annular ring 50.

The annular ring 50 is rotatable around a central axis and a permanent magnet 52, made of rare earth material, is located at a fixed position relative to the axis of rotation, next to the annular ring 50.

Circulation pipes 54 are located around the annular ring 50, just after the permanent magnet 52 in the direction of rotation of the annular ring 50. The circulation pipes 54 are arranged to be in good thermal contact with the annular ring 50. The circulation pipes 54 pass away from the annular ring 50 to a heat exchanger unit 56 arranged so as to exchange heat with ambient. The circulation pipes 54 contain an intermediate fluid, for instance water.

Further circulation pipes 58 are located around the annular ring 50, further away from the permanent magnet 52 in the direction of rotation. The further circulation pipes 58 are again arranged to be in good thermal contact with the annular ring 50. The further circulation pipes 58 pass away from the annular ring 50 to a heat exchanger unit 60 arranged about a refrigeration chamber 62, the refrigeration chamber 62 containing material to be cooled.

The rotatable annular ring 50 is mounted on an assembly 64, and resistive heating elements 66 are located on the assembly 64. A control computer 68 is provided, linked to the resistive heating elements 66 and also to thermometers 70 located near to the annular ring 50. The control computer 68 is programmed so as to maintain the average temperature around the annular ring 50 to be within a pre-determined range.

The permanent magnet 52 is moveable, and can be moved towards and away from the annular ring 50. The position of the permanent magnet 52 and the pre-determined range of temperature are chosen so as to ensure that, in operation, the $Co_2CrAl$ in that part of the annular ring 50 next to the permanent magnet 52 is in the ferromagnetically ordered state, and the $Co_2CrAl$ in that part of the annular ring 50 furthest away from the permanent magnet 52 is in the paramagnetic state.

Operation of the apparatus is now considered with regard to the $Co_2CrAl$ in one particular part of the annular ring (it will be appreciated that the following description will also apply to the $Co_2CrAl$ in the other parts of the annular ring).

As the annular ring 50 is rotated, the part of the ring under consideration passes towards the permanent magnet 52 and experiences an increasing magnetic field. When it gets close to the permanent magnet 52, the $Co_2CrAl$ at that part of the ring 50 undergoes a transition from the paramagnetic state to the ferromagnetically ordered state and heats up. As it passes the circulation pipes 54 the $Co_2CrAl$ passes heat to the intermediate fluid circulating around the circulation pipes and cools.

The part of the ring under consideration then passes further away from the permanent magnet 52 and experiences a decreasing magnetic field. Eventually the magnetic field decreases to such an extent that the $Co_2CrAl$ undergoes a transition from the ferromagnetically ordered state to the paramagnetic state and thus cools further. It then passes the further circulation pipes 58 and heat is passed from the intermediate fluid circulating around the further circulation pipes 58 to the $Co_2CrAl$, cooling the intermediate fluid.

The cooled water is then circulated around the further circulation pipes to the heat exchanger unit 60 arranged about the refrigeration chamber 62, where heat passes from the refrigeration chamber to the cooled intermediate fluid, cooling the refrigeration chamber.

The part of the ring under consideration rotates further around the axis, until it approaches the permanent magnet once again, and the cycle begins again.

The $Co_2CrAl$ used in the preferred embodiment may be replaced in variants of the preferred embodiment in dependence on the temperature range to which the refrigeration chamber is to be cooled. For lower temperatures $Co_2TiAl$ or $Co_2Ti(Sn,Al)$ may be used as the magnetic refrigerant, for instance. For higher temperatures, $Co_2(Cr, Fe)Al$ or $Co_2(Cr, Mn)Al$ may be used as the magnetic refrigerant, for instance. The intermediate fluid may also be changed, depending on the temperature range to which it is subject, in operation.

Behaviour of $Co_2CrAl$, $Co_2TiSn$, and Related Compounds

Aspects of the behaviour of $Co_2CrAl$, $Co_2TiSn$, and related compounds, which makes those compounds particularly suitable for use in magnetic devices are considered in more detail with reference to FIGS. 8 to 12. Details of sample preparation are provided.

Measurements were performed on two samples of $Co_2CrAl$ of different shape.

Both of the samples were prepared by vacuum arc melting together amounts of the components cobalt, chromium, and aluminium in the appropriate proportions (in this case, 2:1:1) until the components combined. In each case the resulting melted mixture was held above the melting temperature to allow the components to mix further.

The mixture was then cooled in a water cooled copper crucible. The resulting ingot was then turned over and remelted, again using vacuum arc melting, before the resulting mixture was again cooled in a water cooled copper crucible.

Characterisation measurements revealed that both of the samples had the composition $Co_{2.06}Cr_{1.04}Al_{0.90}$, with less than 4% variation in stoichiometry throughout the samples. In the following description the samples will be referred to as having the composition $Co_2CrAl$.

Samples of $Co_2CrAl$ prepared as described may be used in magnetic devices as described above. The samples may be shaped, or ground to a powder, as appropriate. Alternatively, samples of $Co_2CrAl$ may be deposited as a layer on a substrate using known deposition techniques, for instance using pulsed laser deposition techniques.

The composition of compounds in the $Co_2CrAl$ family may readily be varied by varying the relative proportions of the constituent materials used in making the compounds. Furthermore, in the $Co_2CrAl$ family amounts of one or more different elements may be partially substituted for any of the cobalt, chromium and aluminium.

In variants of the magnetic devices described above, a sample of $Co_2CrAl$ is replaced by a related compound such as another member of the $Co_2CrAl$ family (at least if that member shares at least some of the characteristics of $Co_2CrAl$ in the region around the transition between ferromagnetically ordered and paramagnetic states) or another Heusler alloy (at least if that other Heusler alloy shares at least some of the characteristics of $Co_2CrAl$ in the region around the transition between ferromagnetically ordered and paramagnetic states).

Figure 8:
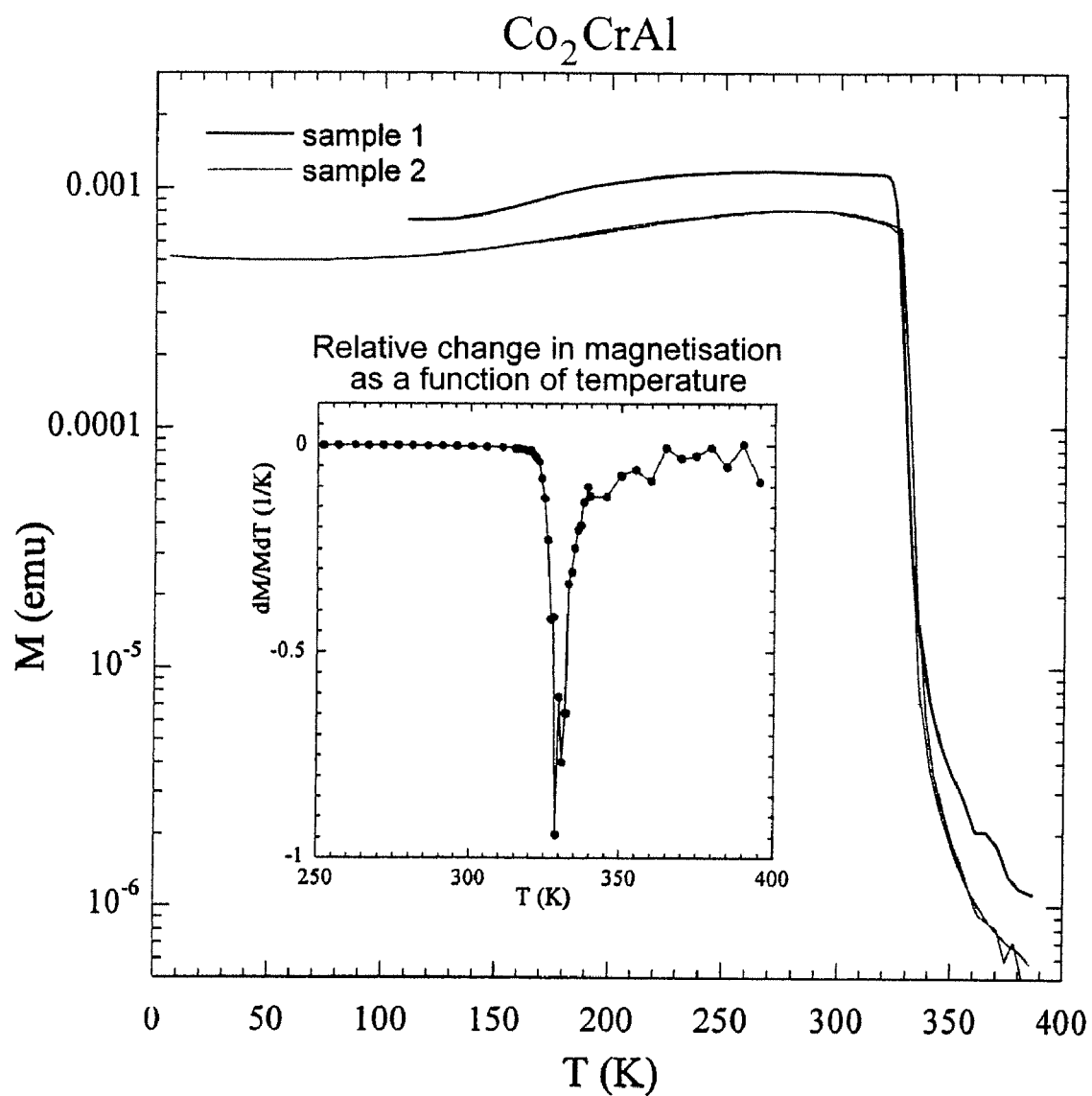
FIG. 8 is a graph of spontaneous magnetization (M) versus temperature (T) for two samples of $Co_2CrAl$ of different shape in nominally zero magnetic field, and includes an inset graph of corresponding values of dM/MdT versus T for the first of the samples.

Turning to the results of measurements on the two samples of $Co_2CrAl$, FIG. 8 is a graph of spontaneous magnetization, M (in e.m.u), versus temperature (T, in Kelvin) for the two samples of $Co_2CrAl$ in nominally zero magnetic field, and includes an inset graph of corresponding values of dM/MdT versus T for the first of the samples.

It can be seen that each of the two samples (referred to as sample 1 and sample 2 in the figure) has a sharp jump in its spontaneous magnetization in zero applied magnetic field at around 330K. For each sample, that jump is caused by the transition from the paramagnetic state to the ferromagnetically ordered state.

The sharpness of the transition between the ferromagnetically ordered state and the paramagnetic state can be appreciated by considering the graph inset in FIG. 8, which shows the variation of dM/MdT with temperature. It can be seen that a sharp change in magnetization occurs over a narrow range of temperatures.

It has been found that the ferromagnetic transition, and in particular the sharpness and size of the change in magnetization, at least in zero or low applied magnetic field, makes $Co_2CrAl$ (and related compounds such as other members of the $Co_2CrAl$ family, and other Heusler alloys) particularly suitable for use in a range of sensors, switches, and memory devices, such as those described above.

Figure 9:
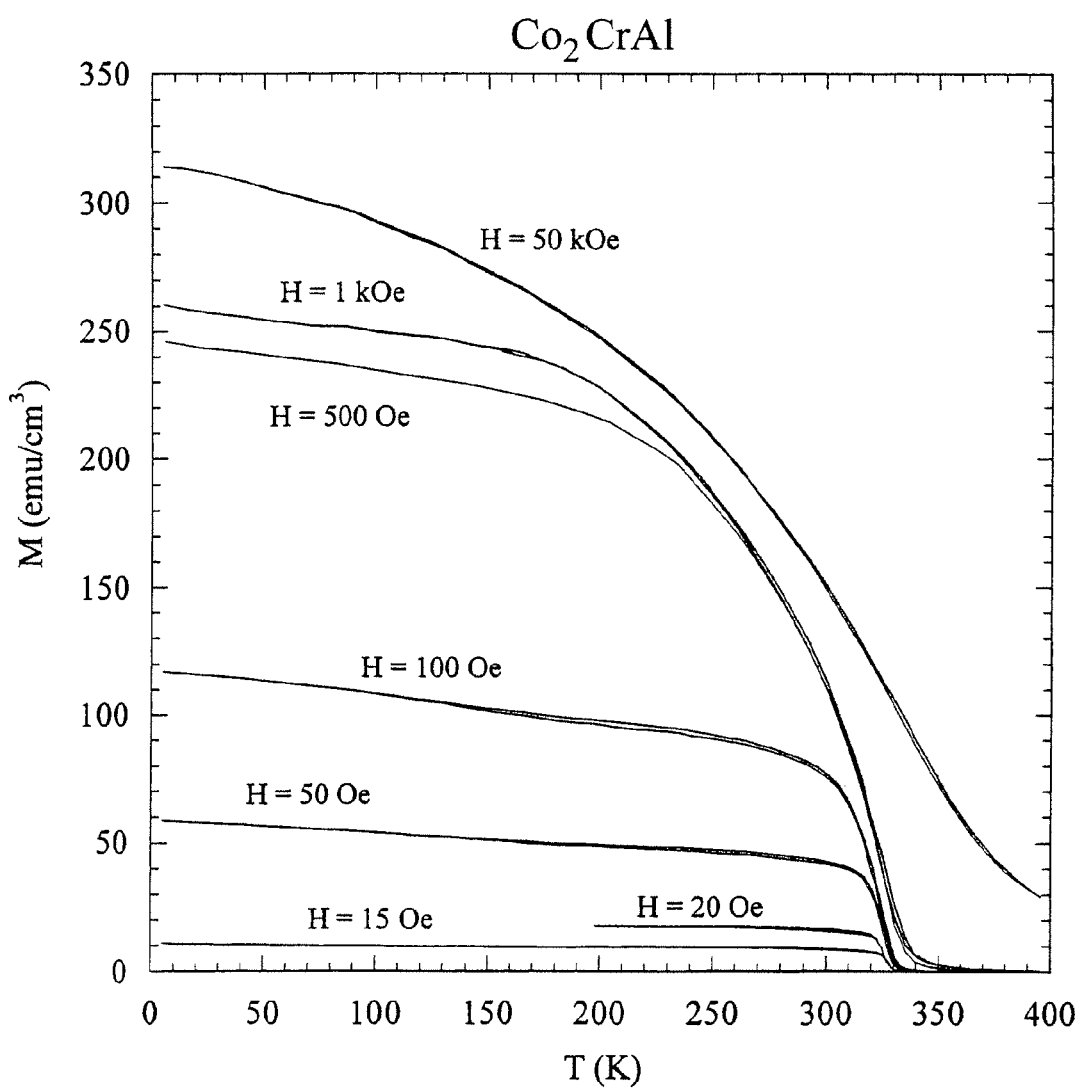
FIG. 9 is a graph of magnetization versus temperature for the second sample of FIG. 1 in a number of different applied magnetic fields.

FIG. 9 shows the variation in magnetization, M (in e.m.u/$cm^3$) versus temperature, T (in Kelvin), for sample 2 of $Co_2CrAl$ in various applied magnetic fields from 15 Oersted (0.0015 Tesla) to 50,000 Oersted (5 Tesla). It can be seen that the Curie temperature shifts significantly with applied magnetic field.

As is suggested by the variation of Curie temperature with magnetic field, $Co_2CrAl$ exhibits a significant magnetocaloric effect, and it has been found that $Co_2CrAl$ (and related compounds such as other members of the $Co_2CrAl$ family, and other Heusler alloys) is particularly suitable as a magnetic refrigerant.

Figure 10:
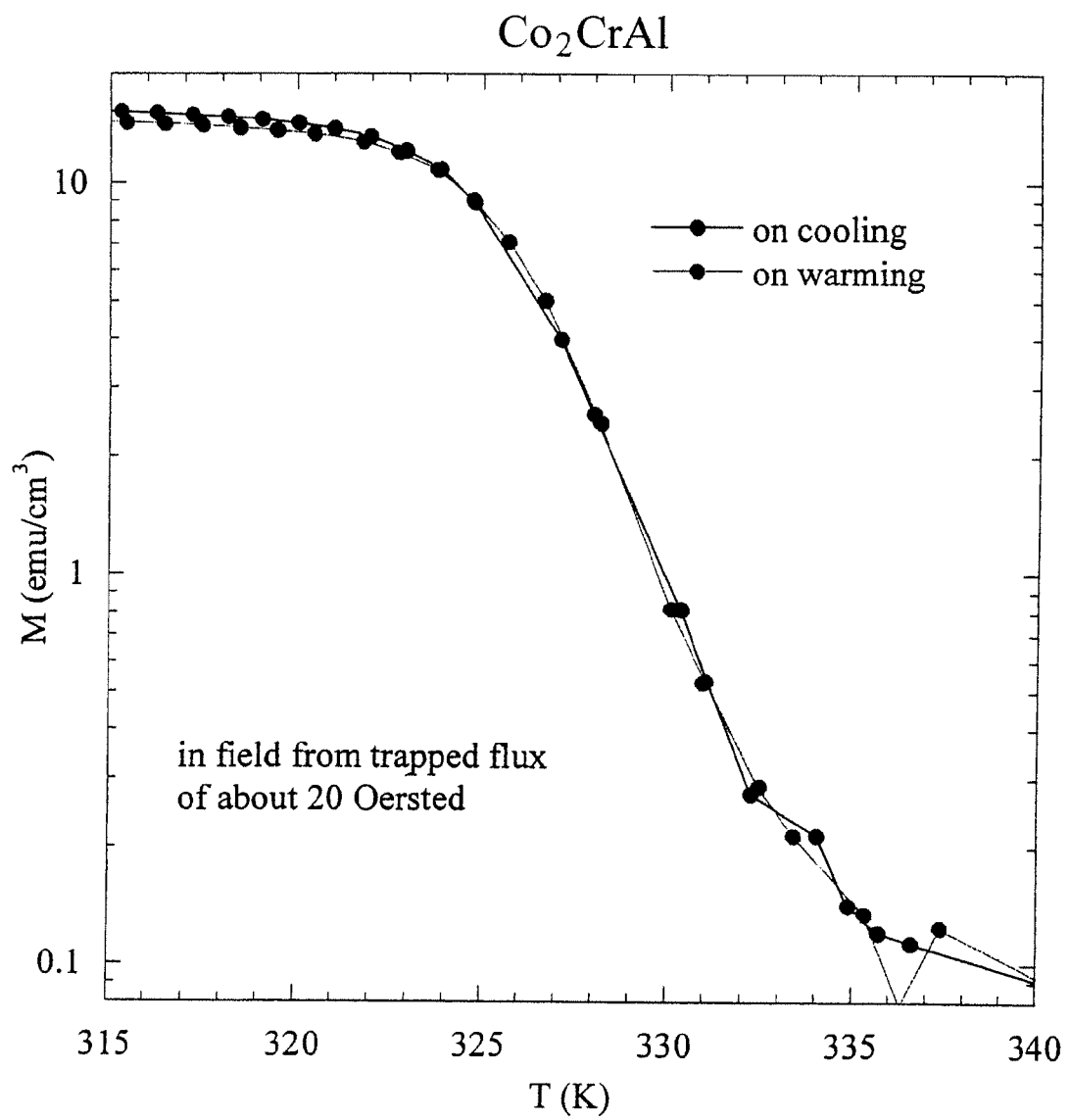
FIG. 10 is a graph of magnetization versus temperature on cooling and on warming of the second sample of FIG. 1 in a magnetic field of around 20 Oersted.

FIG. 10 shows the variation in magnetization, M (in e.m.u/ $cm^3$), for sample 2 of $Co_2CrAl$ with temperature upon warming of the sample and upon cooling of the sample in an applied magnetic field estimated at 20 Oersted. It can be seen that there is little if any hysteresis and that the magnetization of the sample at any given temperature does not differ significantly regardless of whether the sample has been cooled to that temperature or warmed to that temperature.

The lack of hysteresis in the magnetization around the transition region makes $Co_2CrAl$ (and related compounds such as other members of the $Co_2CrAl$ family, and other Heusler alloys) particularly suitable for use in sensors and for applications which rely on a component being switched, reversibly, from one state to another. Such applications include, for instance, switches and memory devices.

Figure 11:
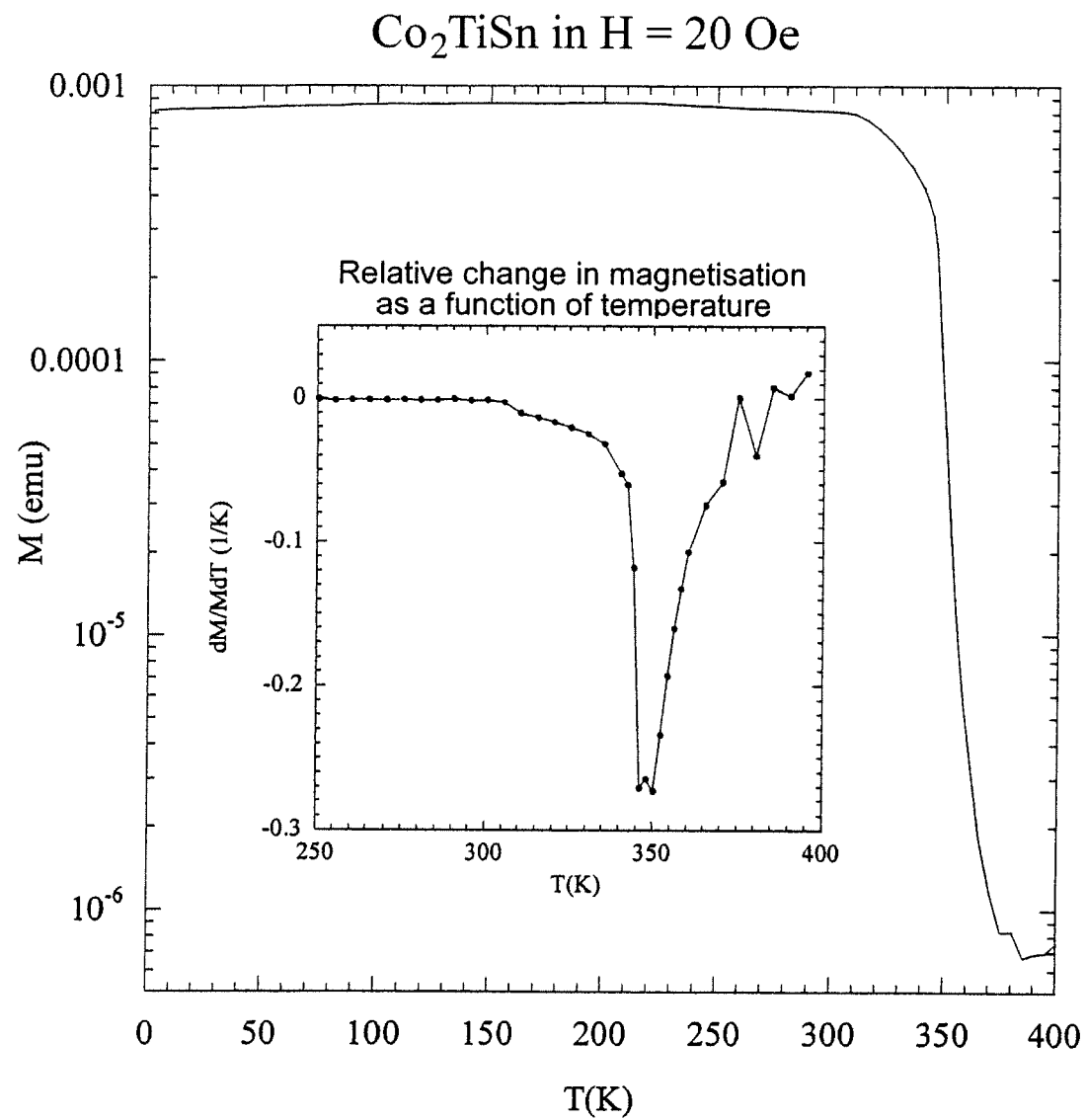
FIG. 11 is a graph of spontaneous magnetization (M) versus temperature (T) for a sample of $Co_2TiSn$ in nominally zero magnetic field, and includes an inset graph of corresponding values of dM/MdT versus T.
Figure 12:
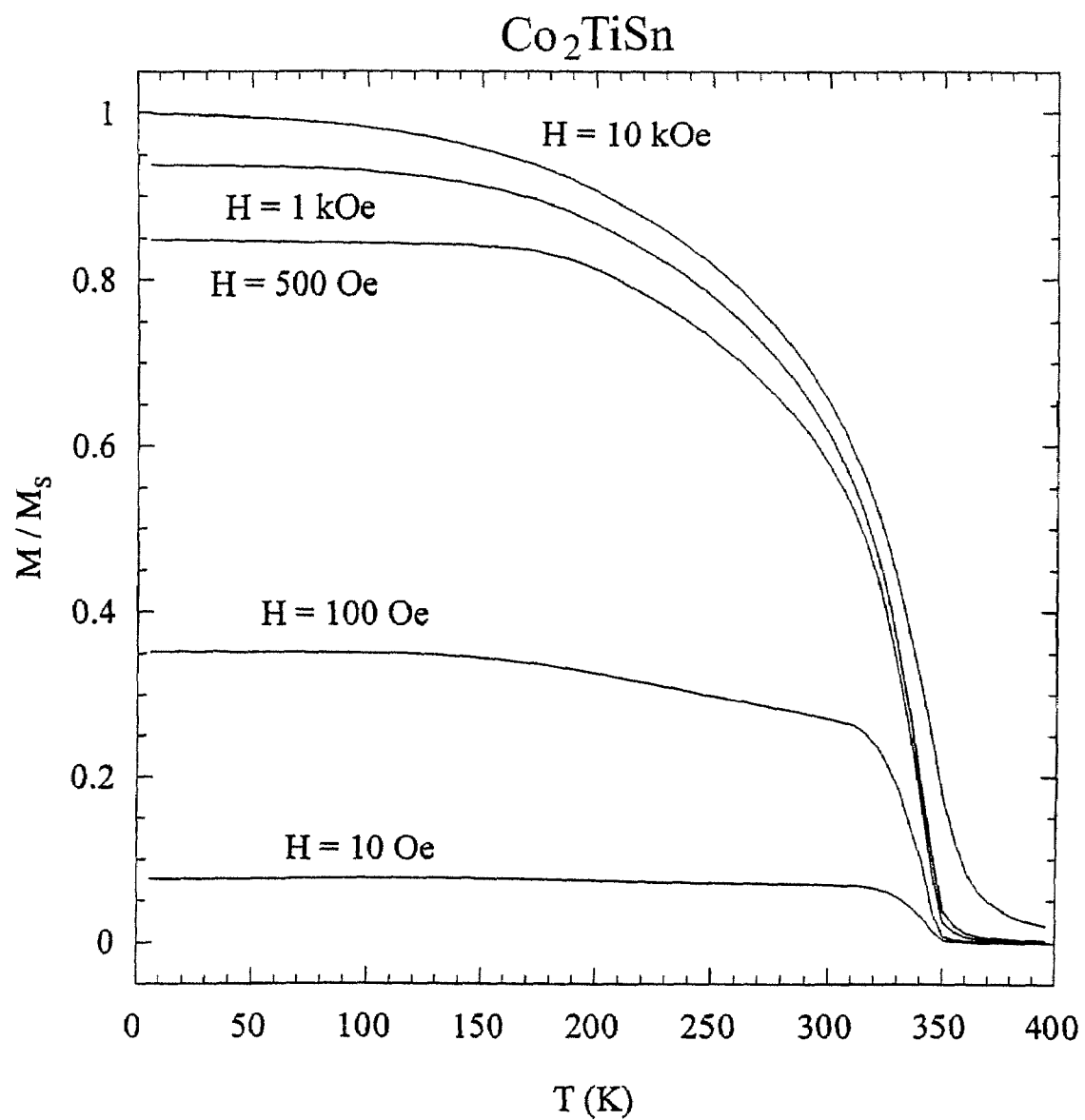
FIG. 12 is a graph of magnetization (normalised by comparison with the saturation magnetization) versus temperature for the sample of $Co_2TiSn$ in a number of different applied magnetic fields.

Turning to consideration of other compounds, one example of a Heusler alloy which may be used in place of $Co_2CrAl$ is $Co_2TiSn$. Magnetization measurements have been performed on a sample of $Co_2TiSn$ and results of the measurements are shown in FIGS. 11 and 12.

As with the samples of $Co_2CrAl$, the sample of $Co_2TiSn$ was prepared by vacuum arc melting together amounts of the components cobalt, titanium, and tin in the appropriate proportions (in this case, 2:1:1) until the components combined. The resulting melted mixture was held above the melting temperature to allow the components to mix further.

Again, the mixture was then cooled in a water cooled copper crucible. The resulting ingot was then turned over and remelted, again using vacuum arc melting, before the resulting mixture was again cooled in a water cooled copper crucible.

Characterisation measurements revealed that the sample had the composition $Co_{1.93}Ti_{1.01}Sn_{1.06}$. The sample was also found to have CoTi inclusions. Further remelting of the sample made the appearance of the CoTi inclusions more pronounced.

Turning to the results of measurements on the sample of $Co_2TiSn$, it can be seen from FIGS. 11 and 12 that $Co_2TiSn$ has a transition between a ferromagnetically ordered state and a paramagnetic state and that the characteristics of the transition are similar to that of $Co_2CrAl$ with a large, sharp jump in magnetization which shifts with applied magnetic field. Those characteristics make $Co_2TiSn$ and related compounds similarly advantageous for use in a variety of magnetic devices.

The composition of compounds in the $Co_2TiSn$ family may readily be varied by varying the relative proportions of the constituent materials used in making the compounds. Furthermore, in the $Co_2TiSn$ family amounts of one or more different elements may be partially substituted for any of the cobalt, titanium and tin.

In variants of the magnetic devices described below, the sample of $Co_2CrAl$ is replaced by $Co_2TiSn$ or a related compound such as a member of the $Co_2TiSn$ family (at least if that member shares at least some of the characteristics of $Co_2TiSn$ in the region around the transition between ferromagnetically ordered and paramagnetic states). In particular, the Cr in $Co_2CrAl$ may usefully be substituted wholly or partially by Fe or Mn or by both Fe and Mn. The Sn in $Co_2TiSn$ may usefully be substituted wholly or partially by Al.

In other embodiments there are other magnetic devices which use $Co_2CrAl$ and related compounds or $Co_2TiSn$ and related compounds or other Heusler alloys, at or close to the transition between their ferromagnetically ordered state and their paramagnetic state, and such other magnetic devices also fall within the scope of the present invention.

It will be understood that the invention has been described above purely by way of example, and modifications of detail can be made within the scope of the invention.

Each feature disclosed in the description and (where appropriate) the claims and drawings may be provided independently or in any appropriate combination.

The invention claimed is:

1. A sensor, comprising a reference sample arranged to be subject to at least one variable physical parameter such that a variation in the value of the at least one variable physical parameter causes a change in the magnetization of the reference sample, means for measuring the magnetization of the reference sample, and means for determining in dependence upon the measured magnetization whether there has been a variation in the value of the at least one variable physical parameter, wherein the reference sample comprises a Heusler alloy.

2. A sensor according to claim 1, wherein the at least one variable physical parameter comprises at least one of temperature, pressure and magnetic field.

3. A sensor according to claim 1, wherein the determining means is adapted to determine the value of the at least one variable physical parameter in dependence upon the measured magnetization.

4. A sensor according to claim 1, further comprising control means adapted to control at least one physical parameter so as to ensure that the Heusler alloy is close to a transition between a first state and a second state, the first state comprising a ferromagnetically ordered state and the second state comprising a paramagnetic state.

5. A sensor according to claim 1, arranged so that a change in the at least one variable physical parameter by at least a pre-determined amount causes the reference sample to change between a first state and a second state, wherein the determining means is adapted to determine, in dependence on the measured magnetization, whether the reference sample is in the first state or the second state.

6. A sensor according to claim 1, wherein the Heusler alloy comprises $Co_{2+x-y}Cr_{1+y}Al_{1-x}$ wherein $-0.10 \leq x \leq 0.10$ and $\leq -0.10 \leq y \leq 0.10$.

7. A sensor, according to claim 1, wherein the Heusler alloy comprises $Co_{2+a-b}Ti_{1+b}Sn_{1-a}$ wherein $-0.10 \leq a \leq 0.10$, and $-0.10 \leq b \leq 0.10$.

8. A sensor according to claim 1, wherein, in the absence of an applied magnetic field, the ferromagnetic transition of the Heusler alloy has a transition width of less than 40K, preferably less than 10K, and more preferably less than 5K.

9. A sensor according to claim 1, wherein the transition between the ferromagnetically ordered state and the paramagnetic state has at least some characteristics which are like those of a first order phase transition, and preferably the transition between the ferromagnetically ordered state and the paramagnetic state is a first order phase transition.

10. A sensor, according to claim 1, wherein the Heusler alloy, in the absence of an applied magnetic field, has a ferromagnetic transition in which dM/MdT (in units of 1/K) is greater than 0.1, preferably greater than 0.5, and more preferably greater than 0.9, wherein M is the spontaneous magnetization of the Heusler alloy, and T is the temperature of the Heusler alloy in K.

11. A sensor, according to claim 1, wherein the Heusler alloy comprises three elements, and preferably comprises at least one additional element, the at least one additional element at least partially substituting for at least one of the three elements.

12. A sensor, according to claim 11, wherein each of the three elements and/or the at least one additional element is one of:—Co, Cr, Ti, Sn, Al, Fe, Mn, Ni, Cu, Ag, Au, Zn, Ru, Ni, Mb, Pt, Hg, W, Ni, Mo.

13. A sensor according to claim 1, wherein the at least one variable physical parameter comprises magnetic field and the change in magnetization comprises a change in direction of magnetization, and the means for measuring the magnetization is adapted to measure the direction of the magnetization.

14. A sensor according to claim 13, further comprising means for changing the direction of magnetization of the reference sample.

15. A sensor according to claim 14, wherein the means for changing the direction of magnetization comprises means for heating the reference sample to cause it to pass from a ferromagnetically ordered state to a paramagnetic state, and means for applying a magnetic field to the reference sample, the means for changing the direction of magnetization being adapted to allow the sample to cool and to enter the ferromagnetically ordered state whilst or after the magnetic field is applied.

16. A bolometer, comprising a reference sample arranged so that absorption of energy by the reference sample causes a rise in temperature of the reference sample and consequently a change in magnetization of the reference sample, and means for measuring the change in magnetization of the reference sample, wherein the reference sample comprises a Heusler alloy.

17. A magnetic memory device, comprising a reference sample, the reference sample comprising a Heusler alloy, the device further comprising means for measuring the magnetization of the reference sample and means for changing the direction of magnetization of the reference sample, the means for changing the direction of magnetization of the sample comprising means for heating the reference sample to cause it to pass from a ferromagnetically ordered state to a paramagnetic state and means for applying a magnetic field to the reference sample.

18. A magnetic memory device according to claim 17, wherein the means for changing the direction of magnetization is adapted to allow the sample to cool and to enter the ferromagnetically ordered state whilst or after the magnetic field is applied.

19. A magnetic memory according to claim 17, comprising an array of reference samples.

* * * * *

UNITED STATES PATENT AND TRADEMARK OFFICE
CERTIFICATE OF CORRECTION

PATENT NO. : 7,641,389 B2  Page 1 of 1
APPLICATION NO. : 11/686719
DATED : January 5, 2010
INVENTOR(S) : Husmann et al.

It is certified that error appears in the above-identified patent and that said Letters Patent is hereby corrected as shown below:

On the title page, Item (30), the Foreign Application Priority Data has been omitted. Item (30) should read:

-- (30)    Foreign Application Priority Data

Mar. 15, 2006   (GB).................................0605219.5 --

Signed and Sealed this

Eleventh Day of May, 2010

David J. Kappos
*Director of the United States Patent and Trademark Office*